United States Patent [19]
Demir et al.

[11] Patent Number: 6,167,359
[45] Date of Patent: Dec. 26, 2000

[54] METHOD AND APPARATUS FOR CHARACTERIZING PHASE NOISE AND TIMING JITTER IN OSCILLATORS

[75] Inventors: Alper Demir, Jersey City, N.J.; Amit Mehrotra, El Cerrito, Calif.; Jaijeet S. Roychowdhury, Murray Hill, N.J.

[73] Assignee: Lucent Technologies Inc., Murray Hill, N.J.

[21] Appl. No.: 09/096,856

[22] Filed: Jun. 12, 1998

[51] Int. Cl.[7] .............................. H04B 15/00; H04B 17/00
[52] U.S. Cl. .......................... 702/191; 702/69; 702/111; 375/226; 375/227
[58] Field of Search ..................... 702/190, 191, 702/69, 70, 76, 111; 703/2, 3; 375/226, 227

[56] References Cited

U.S. PATENT DOCUMENTS

| | | | |
|---|---|---|---|
| 3,828,138 | 8/1974 | Fletcher et al. | 375/344 |
| 5,943,637 | 8/1999 | Okumura | 702/111 |
| 6,020,782 | 2/2000 | Albert et al. | 327/552 |

OTHER PUBLICATIONS

Alper Demir; "Phase Noise in Oscillators: DAES and Colored Noise Sources"; Bell Laboratories, pp. 170–177, 1998

Franz X. Kaertner; "Analysis of White and $f^{-\alpha}$ Noise in Oscillators"; International Journal of Circuit Theory of Application, vol. 18; pp. 485–519, 1990.

F.L. Walls et al., "Extending the Range and Accuracy of Phase Noise Measurement" 42nd Annual Frequency Control Symposium; pp. 432–441, 1988.

Makiki Okumura and Hiroshi Tanimoto, A Time–Domain Method for Numerical Noise Analysis of Oscillators, Proc. of the Asia and South Pacific Design Automation Conference 477–82 (Jan. 1997).

*Primary Examiner*—Marc S. Hoff
*Assistant Examiner*—Bryan Bui
*Attorney, Agent, or Firm*—Ryan, Mason & Lewis, LLP

[57] ABSTRACT

A nonlinear analysis for characterizing phase noise and timing jitter in oscillators is disclosed. The method and apparatus utilize a nonlinear differential equation to characterize the phase error of a given oscillator. A precise stochastic characterization of timing jitter and spectral dispersion is also disclosed based on the nonlinear differential equation. Representative time and frequency domain computational techniques are disclosed for characterizing the phase noise and timing jitter of circuits. In addition, a single scalar constant, c, is utilized to describe jitter and spectral spreading in a noisy oscillator.

18 Claims, 9 Drawing Sheets

SPECTRUM ANALYZER MEASUREMENT

METHOD AND APPARATUS FOR CHARACTERIZING PHASE NOISE AND TIMING JITTER IN OSCILLATORS

FIELD OF THE INVENTION

The present invention relates to design tools for oscillators, and more particularly, to a method and apparatus for characterizing phase noise and timing jitter in oscillators.

BACKGROUND OF THE INVENTION

Oscillators are ubiquitous in physical systems, especially electronic and optical systems, where oscillators are utilized in phase locked loops, voltage controlled oscillators, microprocessors and transceivers. For example, in radio frequency (RF) communication systems, oscillators are used for frequency translation of information signals and for channel selection. Oscillators are also present in digital electronic systems that require a time reference (or clock signal) to synchronize operations.

Noise is a significant problem with oscillators, because introducing even small noise into an oscillator leads to dramatic changes in its frequency spectrum and timing properties. This phenomenon, peculiar to oscillators, is known as phase noise or timing jitter. A perfect oscillator would have localized tones at discrete frequencies (fundamental frequency, $f_0$, and harmonics, $2f_0$ and $3f_0$), as shown in FIG. 1A, but any corrupting noise spreads these perfect tones, resulting in high power levels at neighboring frequencies, as shown in FIG. 1B. Spreading is the major contributor to undesired phenomena, such as interchannel interference, leading to increased bit-error-rates (BER) in RF communication systems.

Another manifestation of the same phenomenon is timing jitter. Timing jitter is important in clocked and sampled-data systems. The uncertainties in switching instants caused by noise lead to synchronization problems. Thus, characterizing how noise affects oscillators is crucial for practical applications. The problem, however, is challenging since oscillators constitute a special class among noisy physical systems. The autonomous nature of oscillators makes them unique in their response to perturbations.

Considerable effort has been expended over the years in understanding phase noise and in developing analytical, computational and experimental techniques for its characterization. For a brief review of such analytical, computational and experimental techniques, see, for example, W. P. Robins, Phase Noise in Signal Sources, Peter Peregrinus (1991); B. Razavi, Analysis, Modeling and Simulation of Phase Noise in Monothilic Voltage-Controlled Oscillators, Proc. IEEE Custom Integrated Circuits Conference (May 1995), each incorporated by reference herein.

In order to compensate for phase noise and timing jitter, the designers of oscillators and devices incorporating oscillators utilize existing commercial tools, such as the tools commercially available from Cadence Design Systems and Hewlett Packard's EESOF, to analyze the single-side band phase noise spectrum as a function of the offset from the fundamental frequency. A typical single-side band phase noise spectrum is shown in FIG. 2. Specific single-side band phase noise values are specified for a given device at various frequencies, in a known manner. Conventional tools for analyzing the single-side band phase noise spectrum typically assume the peak power spectral density (PSD) 150, shown in FIG. 1B, is infinity. Thus, the single-side band phase noise values 210 generated by conventional tools likewise go to infinity, as shown in FIG. 2. It has been found, however, that the estimate of the single-side band phase noise actually has a shape as shown by the curve 220. As a result, if the device being designed is analyzed at a frequency below a given offset frequency, $f_{off}$, 230, the oscillator will be over-designed to compensate for the overestimated single-side band phase noise.

Despite the importance of the phase noise problem and the large number of publications on the subject, a consistent and general treatment, and computational techniques based on a sound theory, are still lacking. Thus, a need exists for a method and apparatus using efficient numerical methods for the characterization of phase noise. A further need exists for a technique that is applicable to any oscillatory system, including electrical systems, such as resonant, ring and relaxation oscillators, and other systems, such as gravitational, optical, mechanical and biological oscillators. Yet another need exists for a tool that estimates the actual power spectral density (PSD) of a given oscillator and accurately characterizes the oscillator's single-side band phase noise spectrum.

SUMMARY OF THE INVENTION

Generally, a nonlinear analysis for characterizing phase noise in oscillators is disclosed. Computational methods in the time and frequency domains are disclosed for accurately predicting the phase noise of an oscillator. The disclosed method and apparatus utilize a nonlinear differential equation that characterizes the phase error of a given oscillator, which can be solved without approximations for random perturbations. In addition, the present invention provides a precise stochastic characterization of timing jitter and spectral dispersion.

In accordance with another aspect of the invention, representative time and frequency domain computational techniques are disclosed for characterizing the phase noise and timing jitter of circuits. The computational techniques require only a knowledge of the steady state of the unperturbed oscillator, and the values of the noise generators. In addition, the separate contributions of noise sources, and the sensitivity of phase noise to individual circuit devices and nodes, can be obtained.

In addition, in accordance with the invention, a single scalar constant, c, is utilized to describe jitter and spectral spreading in a noisy oscillator.

DETAILED DESCRIPTION

As discussed herein, the present invention utilizes a nonlinear analysis to characterize phase noise and timing jitter in oscillators. A nonlinear differential equation is disclosed to characterize the phase error and timing jitter of a given oscillator. In addition, the present invention provides a precise stochastic characterization (based on the nonlinear differential equation) of timing jitter and spectral dispersion.

Figure 3:
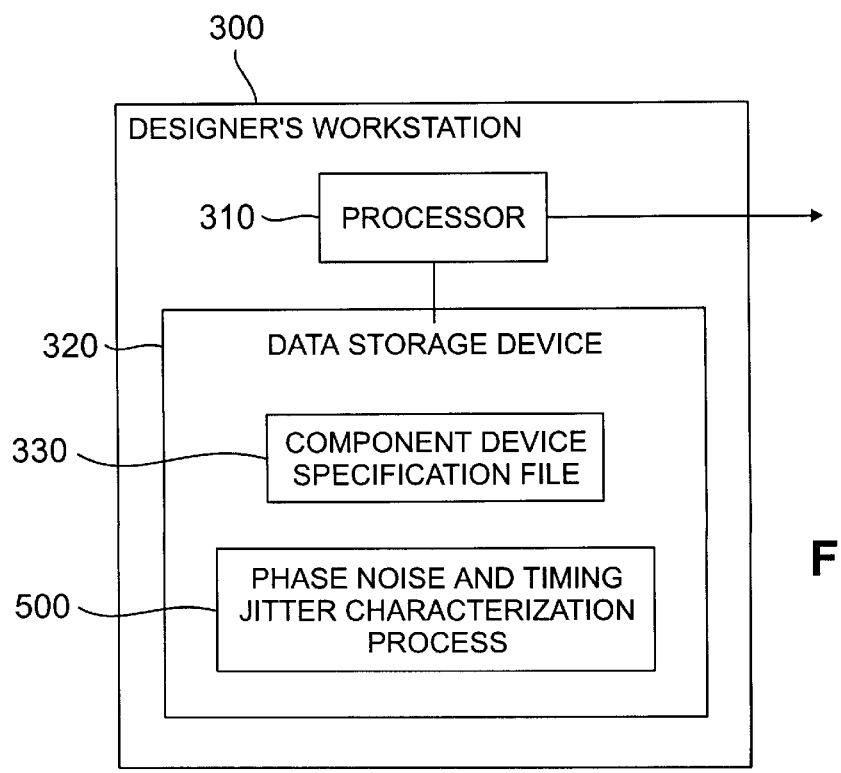
FIG. 3 is a schematic block diagram illustrating a designer's workstation of FIG. 1.

FIG. 3 is a block diagram showing the architecture of an illustrative designer workstation 300. In order to characterize the phase noise and timing jitter in accordance with the present invention, the workstation 300, or other computing device, utilized by the designer, programmer or developer, should contain a number of software components and tools. The workstation 300 preferably includes a processor 310 and related memory, such as a data storage device 320, which may be distributed or local. The processor 310 may be embodied as a single processor, or a number of local or distributed processors operating in parallel. The data storage device 320 and/or a read only memory (ROM) are operable to store one or more instructions, which the processor 310 is operable to retrieve, interpret and execute.

Figure 5:
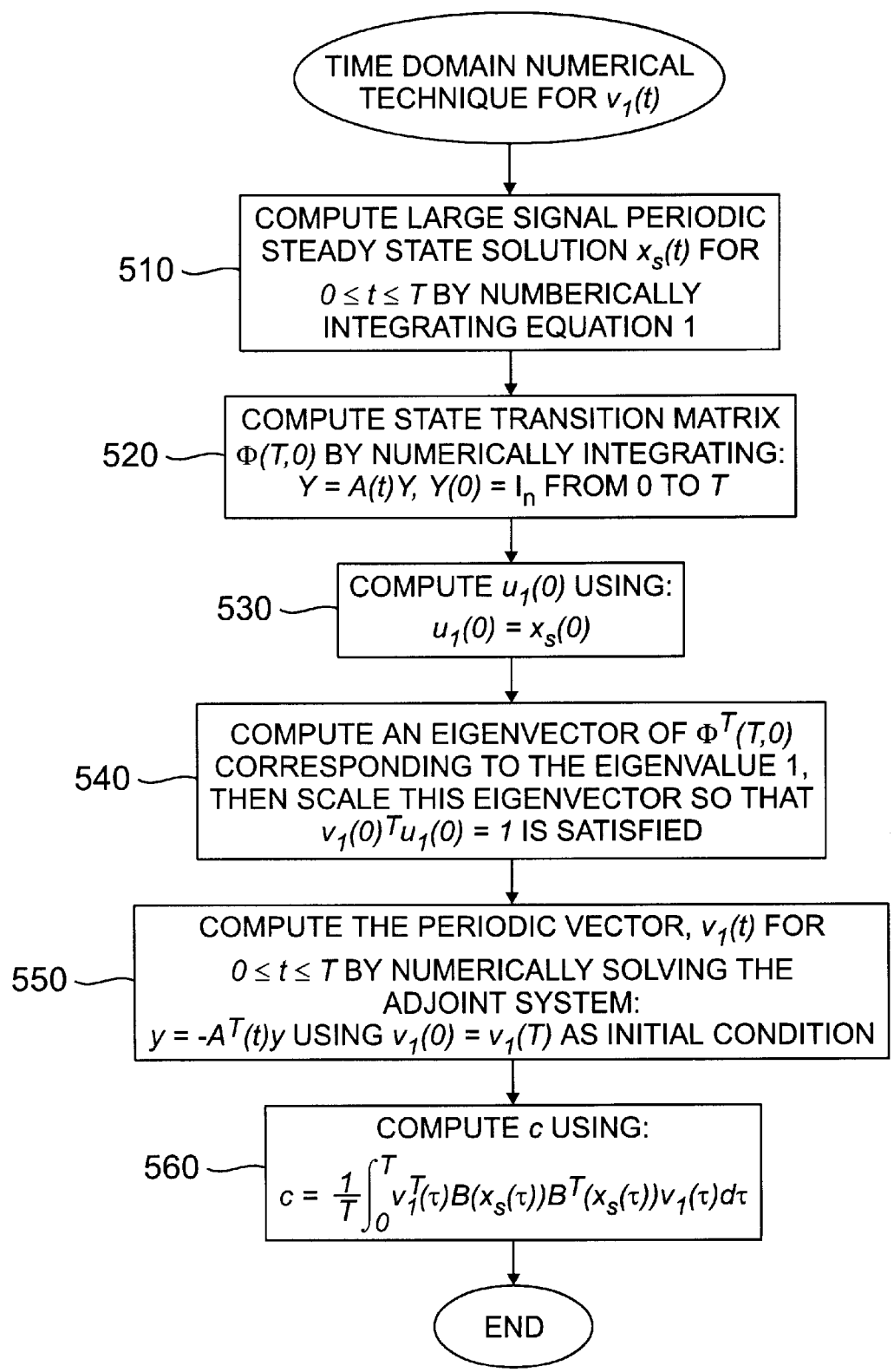
FIG. 5 is a flow chart describing the phase noise and timing jitter characterization process of FIG. 3.

The data storage device 320 preferably includes one or more component device specification file(s) 330, containing specifications on the noise, b(t), contributed by each of the various component devices included in a given oscillator. In addition, as discussed further below in conjunction with FIG. 5, the data storage device 320 also includes a phase noise and timing jitter characterization process 500. The phase noise and timing jitter characterization process 500 disclosed herein is merely representative of the processes which may be implemented to characterize the phase noise and timing jitter in accordance with the present invention. While the phase noise and timing jitter characterization process 500 shown in FIG. 5 is based on a time domain technique, an alternative process based on a frequency domain technique is discussed below in a section entitled Frequency Domain Technique for Calculating $v_1(t)$.

NONLINEAR CHARACTERIZATION OF PHASE SHIFT AND JITTER

Figure 1A:
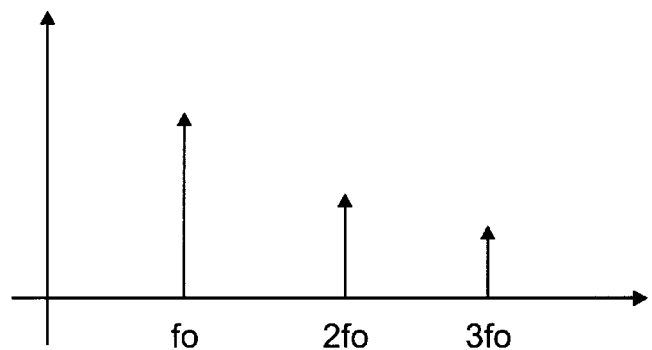
FIG. 1A illustrates the power spectral density (PSD) of an ideal oscillator having localized tones at discrete frequencies.
Figure 4A:
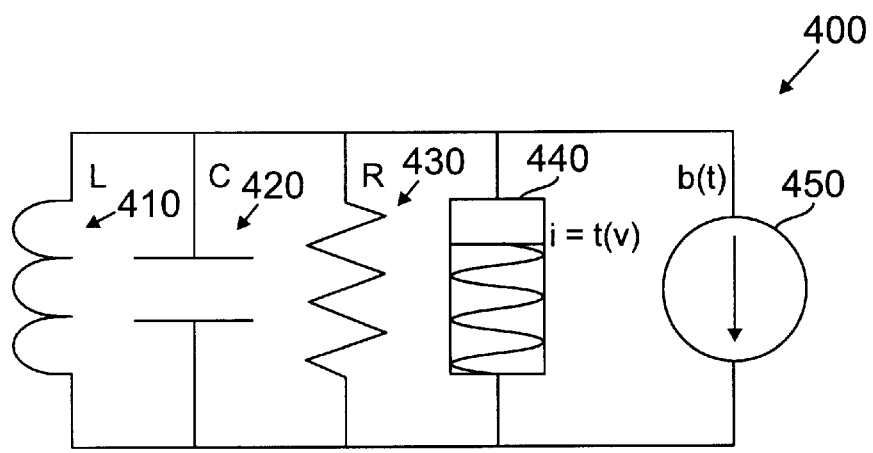
FIG. 4A is a schematic block diagram illustrating a conventional oscillator.
Figure 4B:
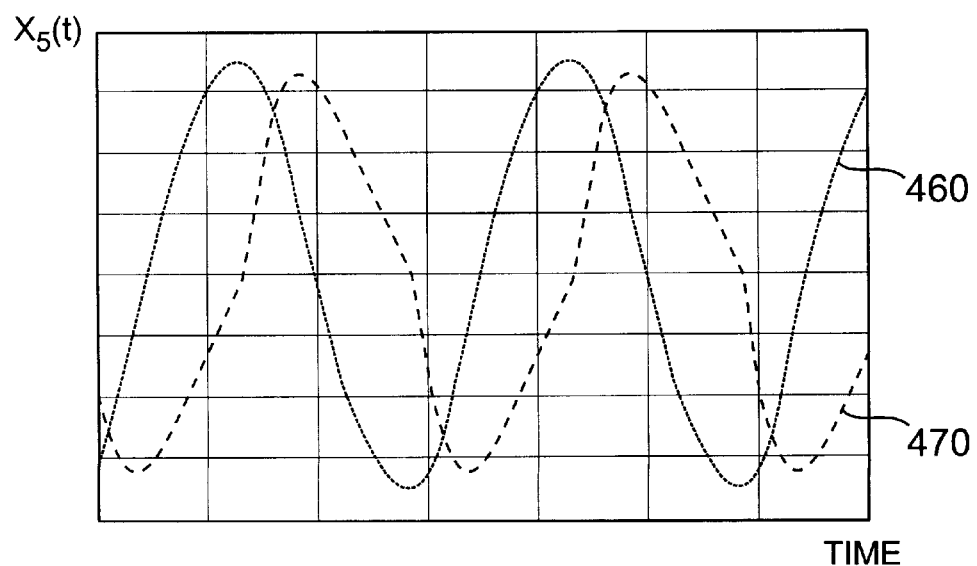
FIG. 4B illustrates the periodic signal, $x_s(t)$, produced by the oscillator of FIG. 4A.

FIG. 4A illustrates an oscillator 400, consisting of a lossy inductor 410 and capacitor 420 circuit with an amplitude-dependent gain provided by a nonlinear resistor 430. The nonlinear resistor 430 has a negative resistance region which pumps energy into the circuit 400 when the voltage across the capacitor 420 drops, thus maintaining stable oscillation, in a known manner. A current source 450 is also present, representing external perturbations due to noise. When there is no perturbation, in other words, when b(t) is zero, the oscillator oscillates with a perfectly periodic signal $x_s(t)$ 460, shown in FIG. 4B. The periodic signal $x_s(t)$ is a vector consisting of the capacitor voltage and the inductor current 460, 470. In the frequency domain, the unperturbed waveform consists of a series of impulses at the fundamental and harmonics of the time period, as shown in FIG. 1A.

In general, the dynamics of any oscillator, such as the oscillator 400, can be described by a system of differential equations:

$$x = f(x) \qquad \text{Eq.1}$$

where $$x \in \mathrm{IR}^n \text{ and } f(\cdot):\mathrm{IR}^n \to \mathrm{IR}^n. \qquad \text{Eq.2}$$

For systems that have a periodic solution $x_s(t)$ (with period T) to equation 1, there is a stable limit cycle in the n-dimensional solution space. While equation 1 describes an oscillator 400 without perturbations or noise, we are interested in the response of such oscillators 400 to a small state-dependent perturbation of the form B(x)b(t), where $$B(\cdot):\mathrm{IR}^n \to \mathrm{IR}^{n \times p} \text{ and } b(\cdot):\mathrm{IR} \to \mathrm{IR}^p. \qquad \text{Eq.3}$$

Thus, the perturbed system is described by $$x = f(x) + B(x)b(t) \qquad \text{Eq.4}$$

Figure 4C:
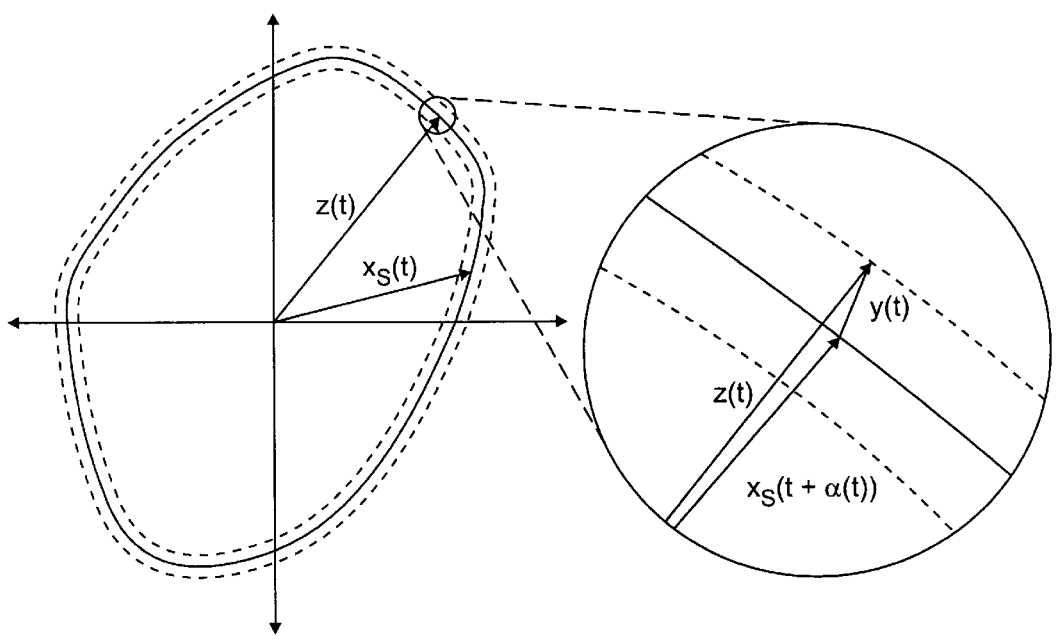
FIG. 4C illustrates the phase deviation, $\alpha(t)$, and orbital deviation, $y(t)$, in the periodic output of the unperturbed oscillator of FIG. 4A.

The response of the oscillator 400 when b(t) is a known deterministic signal, modifies the unperturbed periodic response, $x_s(t)$, of the oscillator 400 to $$x_s(t+\alpha(t))+y(t) \qquad \text{Eq.5}$$

where $\alpha(t)$ is a changing time shift, referred to herein as phase deviation, in the periodic output of the unperturbed oscillator, and y(t) is an additive component, referred to herein as orbital deviation, to the phase-shifted oscillator waveform, as shown in FIG. 4C. $\alpha(t)$ and y(t) can always be chosen such that $\alpha(t)$ will, in general, keep increasing with time even if the perturbation b(t) is always small. The orbital deviation, y(t), on the other hand, will always remain small.

As discussed below, the present invention provides equations for $\alpha(t)$ and y(t) that lead to qualitatively different results about phase noise compared to previous attempts. The equations for $\alpha(t)$ and y(t) of the present invention are based on a nonlinear perturbation analysis that is valid for oscillators, in contrast to previous approaches that rely on linearization.

Thus, in accordance with the present invention, the nonlinear differential equation for the phase shift $\alpha(t)$ is as follows:

$$\frac{d\alpha(t)}{dt} = v_1^T(t + \alpha(t))B(x_s(t+\alpha(t)))b(t), \quad \alpha(0) = 0 \qquad \text{Eq.6}$$

where $v_1(t)$ is a periodically time-varying vector, referred to herein as the Floquet vector. The derivations and proofs of the above results are based on the Floquet theory, described in M. Farkas, Periodic Motions, Springer-Verlag (1994), of linear periodically time-varying systems. From equation 6, if the perturbation is orthogonal to the Floquet vector for all t, the phase error $\alpha(t)$ is zero. The Floquet vector, in general, has no relationship to the tangent vector $x_s(t)$ to the limit cycle. Although some prior theories have assumed that if the perturbation is orthogonal to the tangent vector, then there is no phase error, it has been found that the direction of the perturbation that results in zero phase error is the direction that is orthogonal to the Floquet vector (generally, oblique to the tangent).

STOCHASTIC CHARACTERIZATION

When the perturbation b(t) is assumed to be random noise (a vector of white noise processes), zero-crossing jitter and spectral purity (spreading of the power spectrum) may be determined. Jitter and spectral spreading are in fact closely related, and both are determined by the manner in which $\alpha(t)$, now also a random process, spreads with time. As discussed further below, it has been found that:

(i) the average spread of the jitter (mean-square jitter, or variance) increases precisely linearly with time, such that, $$E[\alpha^2(t)] = \sigma^2(t) = ct \quad \text{Eq. 7}$$

where:

$$c = \frac{1}{T}\int_0^T v_1^T(\tau) B(x_s(\tau)) B^T(x_s(\tau)) v_1(\tau) d\tau \quad \text{Eq. 8}$$

(ii) the power spectrum of the perturbed oscillator is a Lorentzian about each harmonic (a Lorentzian is the shape of the squared magnitude of a one-pole lowpass filter transfer function);

(iii) a single scalar constant, c, is sufficient to describe jitter and spectral spreading in a noisy oscillator; and (iv) the oscillator's output with phase noise ($x_s(t+\alpha(t))$) is a stationary stochastic process.

Figure 1B:
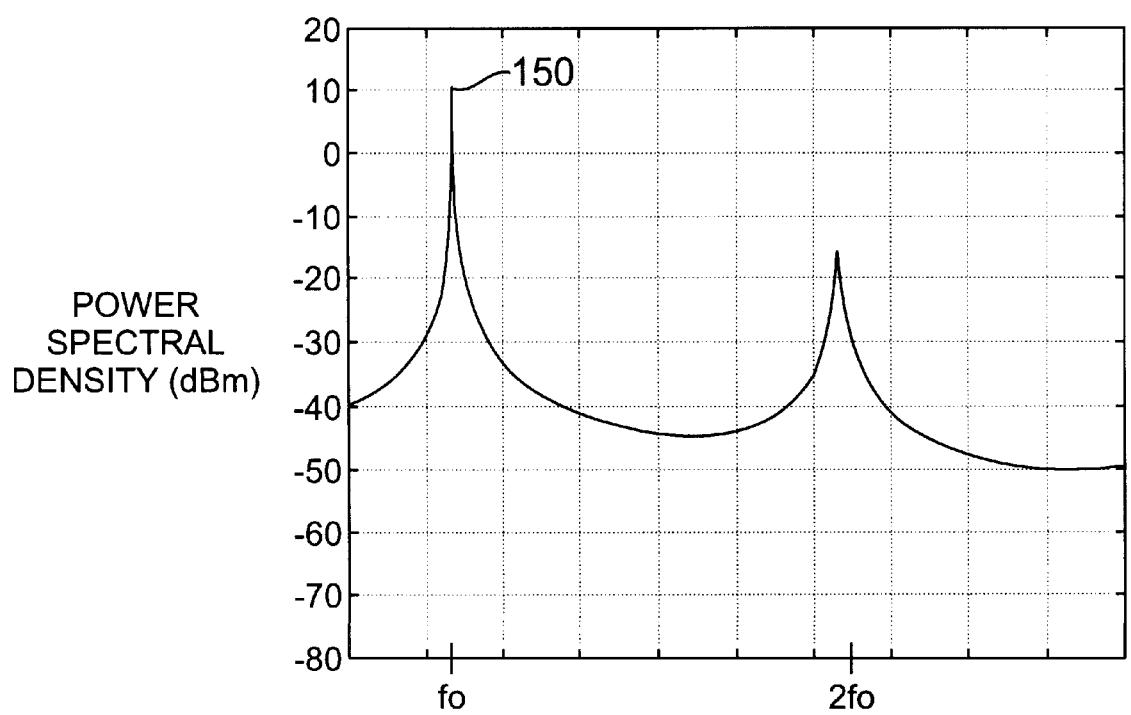
FIG. 1B illustrates the power spectral density (PSD) of an oscillator in the presence of phase noise.
Figure 2:
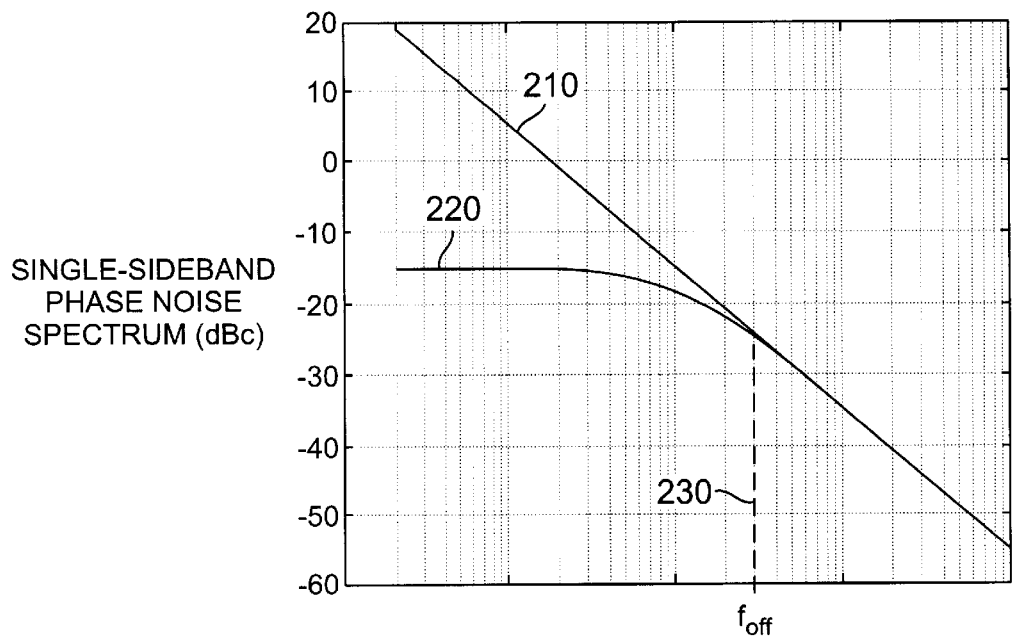
FIG. 2 illustrates the single-side band phase noise characterization produced by conventional tools, as well as in accordance with the present invention.

Thus, if we define $X_1$ to be the Fourier coefficients of $x_s(t)$:

$$x_s(t) = \sum_{i=-\infty}^{\infty} X_i \exp(ji2\pi f_0 t) \quad \text{Eq. 9}$$

then, the spectrum of the stationary oscillator output ($x_s(t+\alpha(t))$) is given by:

$$S(f) = 2\sum_{i=-\infty}^{\infty} X_i X_i^* \frac{f_0^2 i^2 c}{\pi^2 f_0^4 i^4 c^2 + (f + i f_0)^2} \quad \text{Eq. 10}$$

where $f_0 = 1/T$ is the fundamental frequency. The phase deviation $\alpha(t)$ does not change the total power in the periodic signal $x_s(t)$, but it alters the power density in frequency, i.e., the power spectral density. As previously indicated, for the perfect periodic signal $x_s(t)$, the power spectral density (PSD) has delta functions located at discrete frequencies (the fundamental frequency and the harmonics), as shown in FIG. 1A. The phase deviation $\alpha(t)$ spreads the power in these delta functions in the form given in equation 10, which can be experimentally observed with a spectrum analyzer, as shown in FIG. 1B. In this manner, the finite values of the power spectral density (PSD) at the carrier frequency and its harmonics can be obtained for a given oscillator with the present invention (as opposed to prior art systems that predict infinite noise power density at the carrier, as well as infinite total integrated power). That the oscillator output is stationary reflects the fundamental fact that noisy autonomous systems cannot provide a perfect time reference.

In accordance with further features of the present invention, time and frequency domain computational techniques efficient for practical circuits are disclosed. The techniques of the present invention require only a knowledge of the steady state of the unperturbed oscillator 400, and the values of the noise generators. In addition, large circuits are handled efficiently (computation/memory scale linearly with circuit size). Furthermore, the separate contributions of noise sources, and the sensitivity of phase noise to individual circuit devices and nodes, can be obtained easily.

QUANTIFICATION OF JITTER AND SPECTRAL PROPERTIES

As discussed below, several popular characterizations of phase noise that are used in the design of electronic oscillators can be obtained from the stochastic characterization provided in the previous section.

i. Single-Sided Spectral Density and Total Power

The single-sided spectral density is given above by equation 10. The total power, $P_{tot}$, (the integral of the PSD over the range of defined frequencies) is given by:

$$P_{tot} = \int_0^\infty S(f) df = \sum_{i=1}^{\infty} 2|X_i|^2 \quad \text{Eq. 11}$$

It is noted that the total power in the periodic signal $x_s(t)$ (without phase noise) is also equal to the expression in equation 11 (excluding the power in the DC part).

It is further noted that the phase deviation $\alpha(t)$ does not change the total power in the periodic signal $x_s(t)$, but it alters the power density in frequency, i.e., the power spectral density. As previously indicated, for the perfect periodic signal $x_s(t)$, the power spectral density has delta functions located at discrete frequencies (i.e., the harmonics). The phase deviation alpha spreads the power in these delta functions in the form given by equation 10, which can be experimentally observed with a spectrum analyzer.

ii. Spectrum in dBm/Hz

For electrical oscillators, the state variable in the oscillator that is observed as the output is usually a voltage or a current. The spectrum in equation 10 is expressed as a function of frequency ($f$ in Hz), then the PSD is in units of volts$^2$/Hz and amps$^2$/Hz for a voltage and a current state variable respectively. Then, the spectral density of the expected (i.e., average, assuming that the stochastic process ($x_s(t+\alpha(t))$) is ergodic) power dissipated in a 1 $\Omega$ resistor (with the voltage (current) output of the oscillator as the voltage across (current through) the resistor) is equal to the PSD in equation 10 (in watts/Hz), which is usually expressed in dBw/Hz as defined by:

$$S_{dBw}(f) = 10 \log_{10}(S(f) \text{ in watts/Hz}) \quad \text{Eq.12}$$

If $S(f)$ is in miliwatts/Hz, then the PSD in dBm/Hz is given by:

$$S_{dBm}(f) = 10 \log_{10}(S(f) \text{ in milliwatts/Hz}) \quad \text{Eq.13}$$

iii. Single-sideband Phase Noise Spectrum in dBc/Hz

In practice, designers are usually interested in the PSD around the first harmonic, i.e., $S(f)$ for $f$ around $f_0$. The single-sideband phase noise $L(f_m)$ (in dBc/Hz) that is very widely used in practice is defined as:

$$L(f_m) = 10 \log_{10}\left(\frac{S(f_0 + f_m)}{2|X_1|^2}\right) \quad \text{Eq. 14}$$

For "small" values of c, and for $0 \leq f_m << f_0$, equation 14 can be approximated as:

$$L(f_m) \approx 10 \log_{10}\left(\frac{f_0^2 c}{\pi^2 f_0^4 c^2 + f_m^2}\right) \quad \text{Eq. 15}$$

Furthermore, for $\pi f_0^2 c \ll f_m \ll f_0$, $L(f_m)$ can be approximated by:

$$L(f_m) = 10 \log_{10}\left(\left(\frac{f_0}{f_m}\right)^2 c\right) \qquad \text{Eq. 16}$$

It is noted that the approximation of $L(f_m)$ in equation 16 does not apply as $f_m \to 0$. For $0 \leq f_m < \pi f_0^2 c$, equation 16 is not accurate, in which case the approximation in equation 15 should be used.

iv. Timing Jitter

In some applications, such as clock generation and recovery, a designer is interested in a characterization of the phase/time deviation $\alpha(t)$ itself rather than the spectrum of $(x_s(t+\alpha(t))$. In these applications, an oscillator generates a square-wave like waveform to be used as a clock.

The effect of the phase deviation $\alpha(t)$ on such a waveform is to create jitter in the zero-crossing or transition times. According to equation 7, $\alpha(t)$ (for an autonomous oscillator) becomes a random variable with a linearly increasing variance. If one of the transitions (i.e., edges) of a clock signal is used as a reference (i.e., trigger) transition and it is synchronizes with t=0, and if the clock signal is perfectly periodic, then the transitions occur exactly at $t_k$=kT, k=1,2, . . . where T is the period. For a clock signal with a phase deviation $\alpha(t)$ that has a linearly increasing variance as above, the timing of the k-th transition $t_k$ will have a variance (i.e., mean-square error) given by:

$$E[(t_k-kT)^2]=ckT \qquad \text{Eq. 17}$$

The spectral dispersion caused by $\alpha(t)$ in an oscillation signal can be observed with a spectrum analyzer. Similarly, a designer can observe the timing jitter caused by $\alpha(t)$ using a sampling oscilloscope. McNeill experimentally observed the linearly increasing variance for the timing of the transitions of a clock signal generated by an autonomous oscillator, as predicted by our theory (see J. A. McNeill, Jitter in Ring Oscillators, PhD thesis, Boston University (1994)). Moreover, c (in $\sec^2$.Hz) in equation 17 exactly quantifies the rate of increase of timing jitter with respect to a reference transition. Another useful figure of interest is the cycle-to-cycle timing jitter, i.e., the timing jitter in one clock cycle, which has a variance cT.

v. Noise Source Contributions

The scalar constant c appears in the characterizations discussed above. It is given by equation 8, where $B(\cdot)$: $IR^n \to IR^{n \times p}$ represents the modulation of intensities of the noise sources with the large-signal state. Equation 8 can be rewritten as:

$$c = \sum_{i=1}^{p} \frac{1}{T}\int_0^T [v_1^T(\tau)B_i(\tau)]^2 d\tau = \sum_{i=1}^{p} c_i \qquad \text{Eq. 18}$$

where p is the number of the noise sources, i.e., the column dimension of $B(x_s(\cdot))$, and $B_i(\cdot)$ is the i-th column of $B(x_s(\cdot))$ which maps the i-th noise source to the equations of the system. Hence, $$c_i = \frac{1}{T}\int_0^T [v_1^T(\tau)B_i(\tau)]^2 d\tau \qquad \text{Eq. 19}$$

represents the contribution of the i-th noise source to c. Thus, the ratio $$\frac{c_i}{c} = \sum_{i=1}^{P} c_i$$

can be used as a figure of merit representing the contribution of the i-th noise source to phase noise/timing jitter. Note that the phase error $\alpha(t)$ is described by a nonlinear differential equation where the noise sources are the excitations. Hence, one can not use the superposition principle to calculate the phase error arising from multiple noise sources. On the other hand, the phase error variance, $\sigma^2(t)$=ct, is linearly related to the noise sources, i.e., the variance of phase error since two noise sources is the summation of the variances due to the noise sources considered separately.

vi. Phase Noise Sensitivity

The phase noise/timing jitter sensitivity of the k-th equation (i.e., node) can be defined as:

$$c_s^{(k)} = \frac{1}{T}\int_0^T [v_1^T(\tau)e_k]^2 d\tau \qquad \text{Eq. 20}$$

since $e_k$ represents a unit intensity noise source added to the k-th equation (i.e., connected to the k-th node) in equation 1. The phase noise sensitivity of nodes can provide useful information in search for novel oscillator architectures with low phase noise.

PROCESSES

As previously indicated, the phase noise and timing jitter characterization process 500, shown in FIG. 5, is representative of the processes which may be implemented to characterize the phase noise and timing jitter in accordance with the present invention. While the phase noise and timing jitter characterization process 500 shown in FIG. 5 is based on a time domain technique, an alternative process based on a frequency domain technique is discussed below in a section entitled Frequency Domain Technique for Calculating $v_1(t)$.

As shown in FIG. 5, the phase noise and timing jitter characterization process 500 initially computes the large signal periodic steady state solution $x_s(t)$ for $0 \leq t \leq T$ by numerically integrating equation 1, during step 510. In one embodiment, the shooting method technique disclosed in K. S. Kundert et al., Steady-State Methods for Simulating Analog and Microwave Circuits, Academic Publishers (1990) is utilized.

Thereafter, the phase noise and timing jitter characterization process 500 computes the state transition matrix $\Phi(T,0)$ by numerically integrating:

Y=A(t)Y, Y(0)=$I_n$ from 0 to T during step 520, where the Jacobian $$A(t) = \left.\frac{\partial f(x)}{\partial x}\right|_{x_s(t)}$$

is T-periodic.

It is noted that $\Phi(T, 0)$=Y(T). $u_1(0)$ is then computed during step 530 using:

$U_1(0)$=$x_s(0)$. It is further noted that $u_1(0)$ is an eigencevector of $\Phi(T, 0)$ corresponding to the eigenvalue 1.

An eigenvector of $\Phi^T(T,0)$ corresponding to the eigenvalue 1 is computed during step 540 and then scaled so that $v_1(0)^T u_1(0)$=1 is satisfied. It is noted that $v_1(0)$ is an eigenvector of $\Phi^T(T,0)$ corresponding to the eigenvalue 1. The periodic vector, $v_1(t)$, for $0 \leq t \leq T$ is computed during step 550 by numerically solving the adjoint system:

$y = -A^T(t)y$ using $v_1(0) = v_1(T)$ as the initial condition.

Finally, c is computed during step 560 using the following equation:

$$c = \frac{1}{T} \int_0^T v_1^T(\tau) B(x_s(\tau)) B^T(x_s(\tau)) v_1(\tau) d\tau.$$

In implementing the above algorithm, one can increase the efficiency by saving LU factored matrices that need to be calculated during step 520 and reuse them in step 550. If the periodic steady-state $x_s(t)$ of the oscillator is calculated using the shooting method, referenced above, in step 510, then the state transition matrix $\Phi(T, 0)$ of the linear time-varying system obtained by linearizing the nonlinear oscillator circuit around the periodic steady-state is already available. It can be shown that the Jacobian of the nonlinear system of equations that is solved in the shooting method (using Newton's method, to calculate the initial condition that results in the periodic steady-state solution) is equal to $\Phi(T, 0)-1$ (see T. J. Aprille and T. N. Trick, A Computer Algorithm To Determine The Steady-State Response Of Nonlinear Oscillators, IEEE Transactions on Circuit Theory, CT-19 (4):354–360 (July, 1972); T. J. Aprille and T. N. Trick, Steady-State Analysis of Nonlinear Circuits With Periodic Inputs, Proceedings of the IEEE, 60(1):108–114 (January, 1972)).

Moreover, one can avoid calculating $\Phi(T, 0)$ explicitly, and use iterative methods both for the shooting method, and at step 540 to calculate the eigenvector of $\Phi^T(T, 0)$ that corresponds to the eigenvalue 1 (see R. Telichevesky et al, Efficient Steady-State Analysis Based On Matrix-Free Krylov-Subspace Methods, Proc. Design Automation Conference (June, 1995)). For high-Q oscillators, the iterative methods can run into problems, because $\Phi(T, 0)$ may have several other eigenvalues which are close to 1. In our implementation in SPICE, we explicitly calculate $\Phi(T, 0)$ and perform a full eigenvalue/eigenvector calculation, which allows us to investigate the properties of the state-transition matrix for various oscillator circuits. Even with a full eigenvalue/eigenvector calculation for $\Phi(T, 0)$, the phase noise characterization algorithm discussed above is still very efficient. The phase noise characterization comes "almost" for free, once the periodic steady-state solution $x_s(t)$ is computed.

The state transition matrix is given by:

$$\Phi(t,s) = U(t) \exp(D(t-s)) V(s)$$

where $U(t)$ is a T-periodic nonsingular matrix, $V(t) = U^{-1}(t)$ and $\text{diag}[\mu_1, \ldots \mu_n]$, where $\mu_I$ are the Floquet (characteristic) exponents. $\exp(\mu_i T)$ are called characteristic multipliers.

Frequency Domain Technique for Calculating $v_1(t)$

As previously indicated, the phase noise and timing jitter characterization process 500, shown in FIG. 5, can alternatively be based on a frequency domain technique. In a frequency domain embodiment, the matrices $U_i$ and $V_i$ are defined to be the Fourier components of $U(t)$ and $V(t)$, such that, $$U(t) = \sum_{i=-\infty}^{\infty} U_i e^{j\omega_0 i t}$$

$$V(t) = \sum_{i=-\infty}^{\infty} V_i e^{j\omega_0 i t}$$

The block-Toeplitz matrices U and V are defined as follows:

$$U = \begin{pmatrix} U_0 & U_1 & U_2 & \cdots & \cdots \\ U_{-1} & U_0 & U_1 & U_2 & \cdots \\ U_{-2} & U_{-1} & U_0 & U_1 & U_2 \\ \cdots & U_{-2} & U_{-1} & U_0 & U_1 \\ \cdots & \cdots & U_{-2} & U_{-1} & U_0 \end{pmatrix}$$

$$V = \begin{pmatrix} V_0 & V_1 & V_2 & \cdots & \cdots \\ V_{-1} & V_0 & V_1 & V_2 & \cdots \\ V_{-2} & V_{-1} & V_0 & V_1 & V_2 \\ \cdots & V_{-2} & V_{-1} & V_0 & V_1 \\ \cdots & \cdots & V_{-2} & V_{-1} & V_0 \end{pmatrix}$$

U and V are both invertible, since $$UV = \begin{pmatrix} \ddots & & & & & \\ & I & & & & \\ & & I & & & \\ & & & I & & \\ & & & & I & \\ & & & & & \ddots \end{pmatrix}$$

and $U(t)$ and $V(t)$ are both bi-orthonormal. $D_k(\omega)$ is defined as:

$$D(\omega) = \begin{pmatrix} \ddots & & & & & \\ & D_2(\omega) & & & & \\ & & D_1(\omega) & & & \\ & & & D_0(\omega) & & \\ & & & & D_{-1}(\omega) & \\ & & & & & D_{-2}(\omega) \\ & & & & & & \ddots \end{pmatrix}$$

In addition, $D_k(\omega)$ is singular for $\omega = k\omega_0$, if the oscillator is asymptotically orbitally stable. The frequency domain conversion matrix, $H(\omega)$ of the oscillator is related to U, $D(\omega)$ and V by:

$$H(\omega) = UD^{-1}(\omega)V.$$

$H^{-1}(0)$ is a singular matrix (with rank-deficiency one) and the null space of its transpose is spanned by the Fourier components of $v_1(t)$, such that, $\ker(H^{-T}(0)) = [1\ 0\ \ldots\ 0\ ][\ \ldots\ V_{-2}\ V_{-1}\ V_0\ V_1\ V_2\ \ldots\ ] = [\ \ldots\ V_1^T{}_{,-2}\ V_1^T{}_{,-1}\ V_1^T{}_{,0}\ V_1^T{}_{,1}\ V_1^T{}_{,2}\ \ldots\ ]$ where $V_{1,i}$ are the Fourier coefficients of $kv_1^T(t)$, for some nonzero scalar k, such that, $$kv_1^T(t) = \Sigma V_1^T{}_{,i} e^{j\omega_0 i t}$$

$H^{-T}(0)$ is simply the transpose of the Harmonic Balance Jacobian matrix of the oscillator at solution. Its null space can be found efficiently even for large circuits by using iterative linear algebra techniques. For a more detailed discussion of such techniques, see J. Roychowdhury et al., Cyclostationary Noise Analysis of Large RF Circuits With Multi-Tone Excitations, IEEE Journal of Solid-State Circuits, March, 1998, incorporated by reference herein. Hence a scaled version of $v_1^T(t)$ can be found easily. The scaling constant k can be found by applying $v_1^T(t) u_1(t)=1$, $u_1(t)$ having first been obtained by differentiating the large-signal steady state solution of the oscillator.

PRACTICAL EXAMPLE

Figure 6:
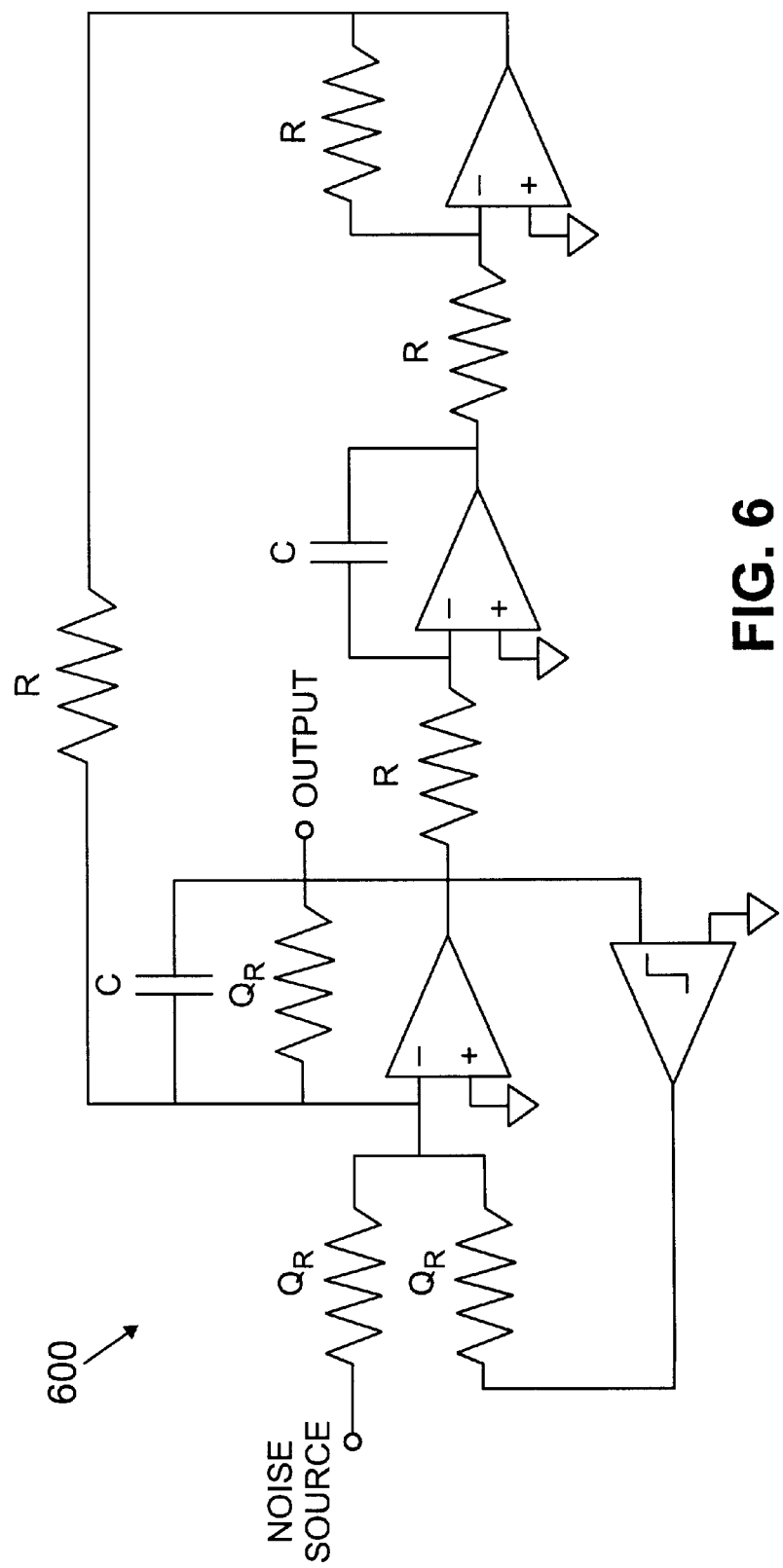
FIG. 6 is a schematic block diagram illustrating a conventional oscillator.
Figure 7A:
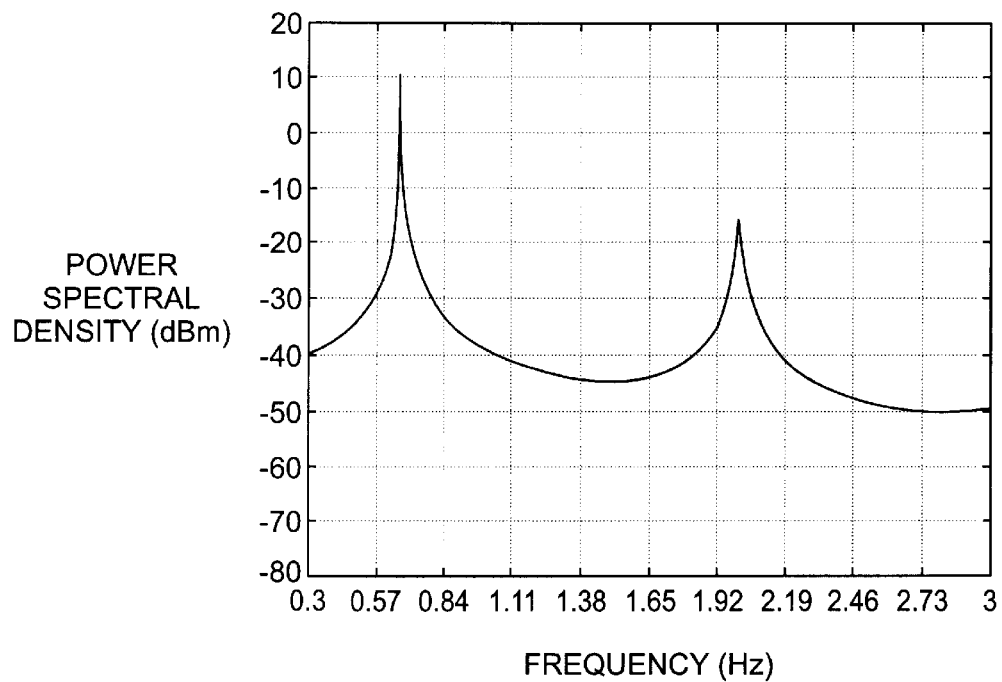
FIGS. 7A through 7F show various characterizations of the output of the oscillator shown in FIG. 6.
Figure 7B:
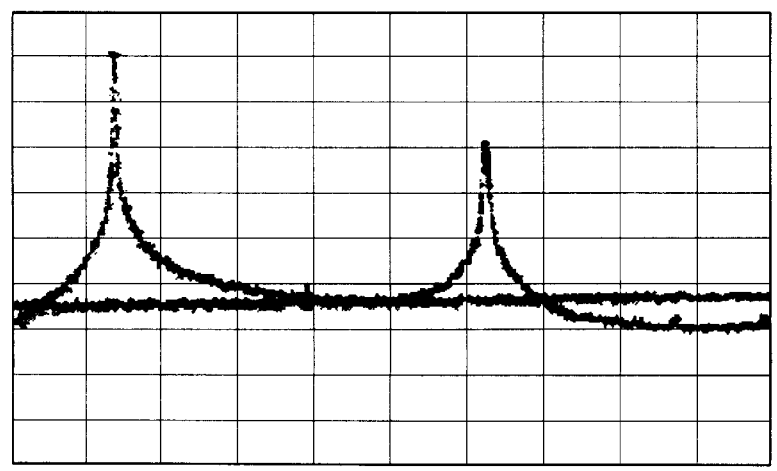

The oscillator 600, shown in FIG. 6, consists of a Tow-Thomas second-order bandpass filter and a comparator. If the OpAmps are considered to be ideal, it can be shown that the oscillator 600 is equivalent (in the sense of the differential equations that describe it) to a parallel RLC circuit in parallel with a nonlinear voltage-controlled current source (or equivalently a series RLC circuit in series with a nonlinear current-controlled voltage source) as shown in FIG. 4A. For Q=1 and $f_0$=6.66 kHz, we performed a phase noise characterization of this oscillator using our numerical methods, and computed the periodic oscillation waveform $x_s(t)$ for the output and c=7.56×$10^{-8}$ $sec^2$.Hz. FIG. 7A shows the PSD of the oscillator output computed using equation 10, and FIG. 7B shows the spectrum analyzer measurement.

Figure 7C:
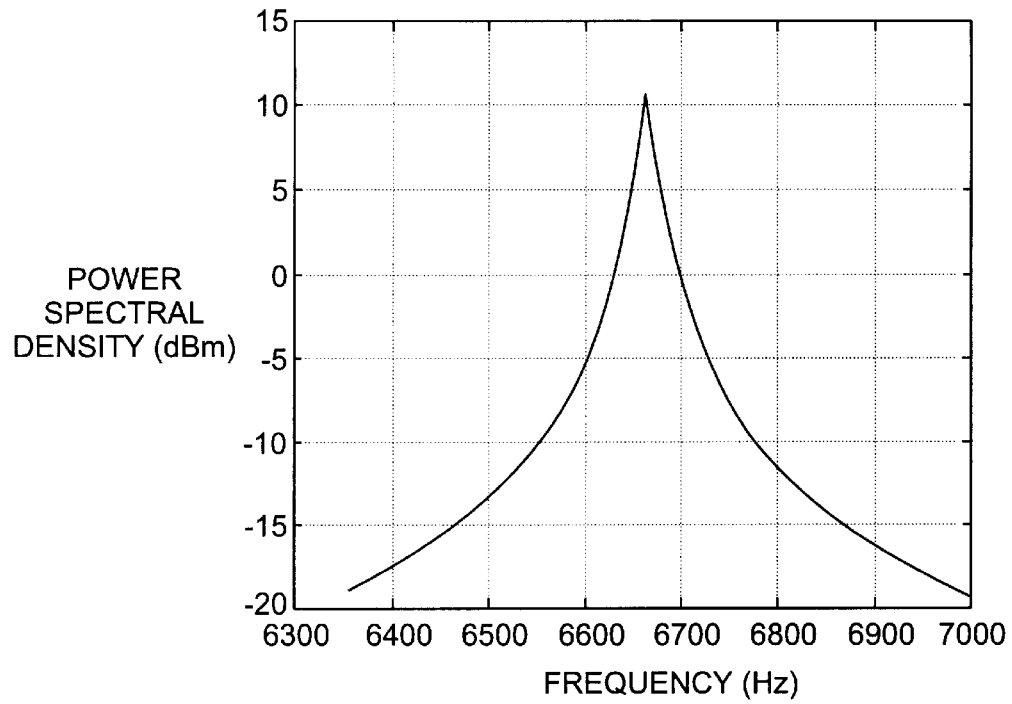
Figure 7D:
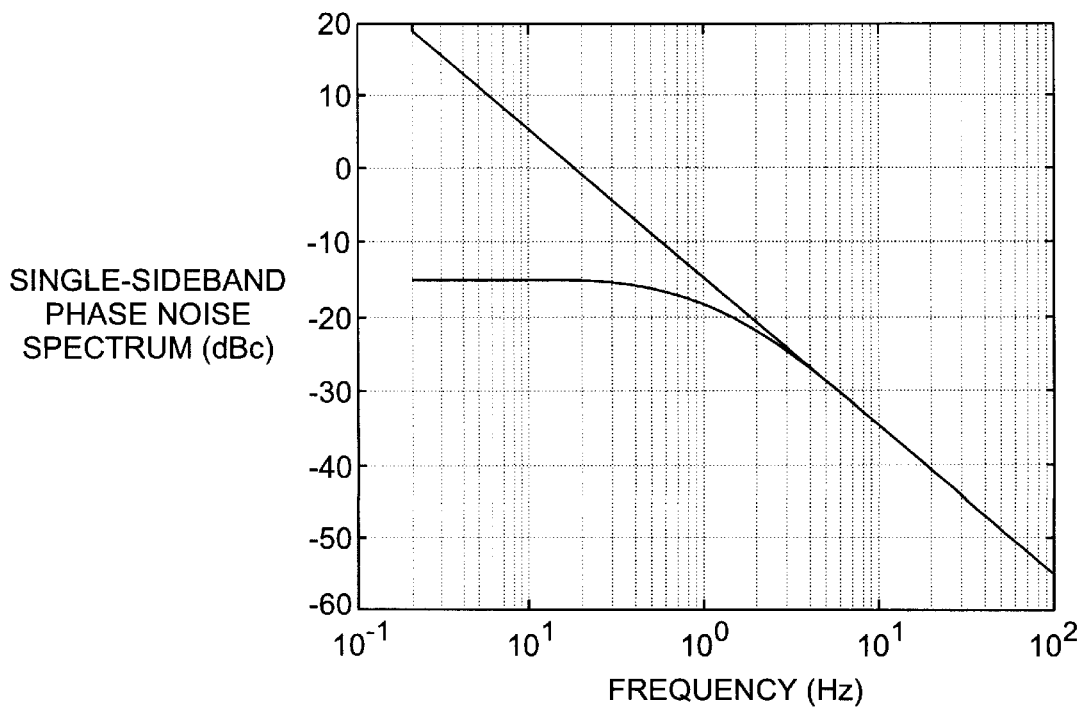

FIG. 7C shows a blown up version of the PSD around the first harmonic. The single-sideband phase noise spectrum using both equations 14 and 15 is in FIG. 7D. It is again noted that equation 15 cannot predict the PSD accurately below the cut-off frequency $f_c=\pi f_0^2 c$=10.56 Hz (marked with a * in FIG. 7D of the Lorentzian).

Figure 7E:
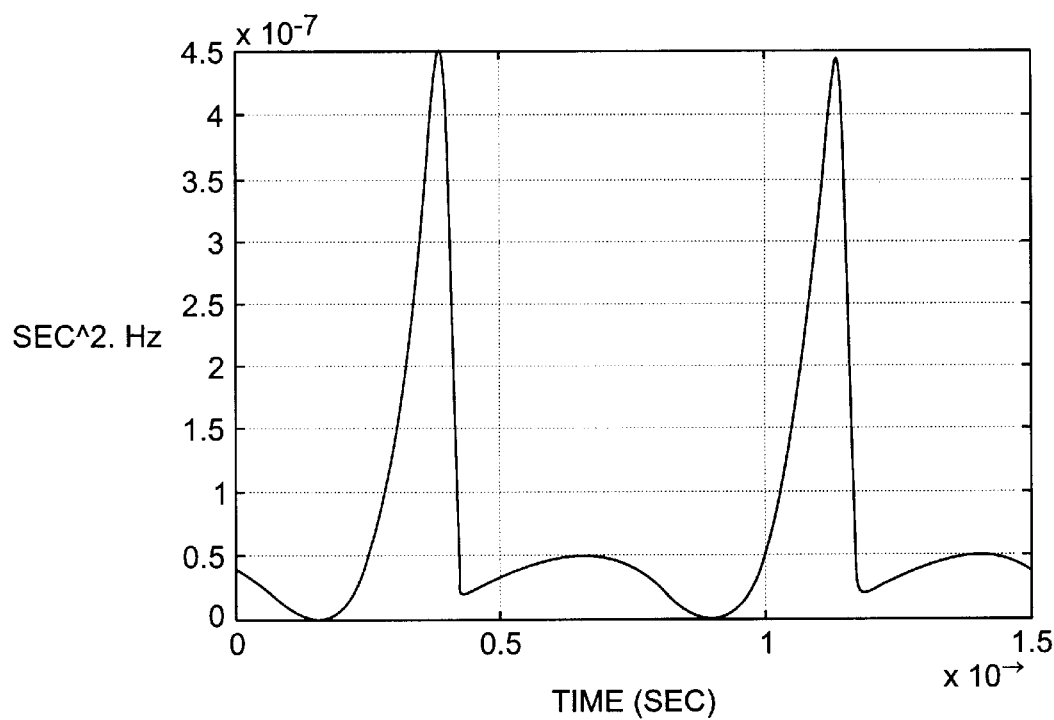
Figure 7F:
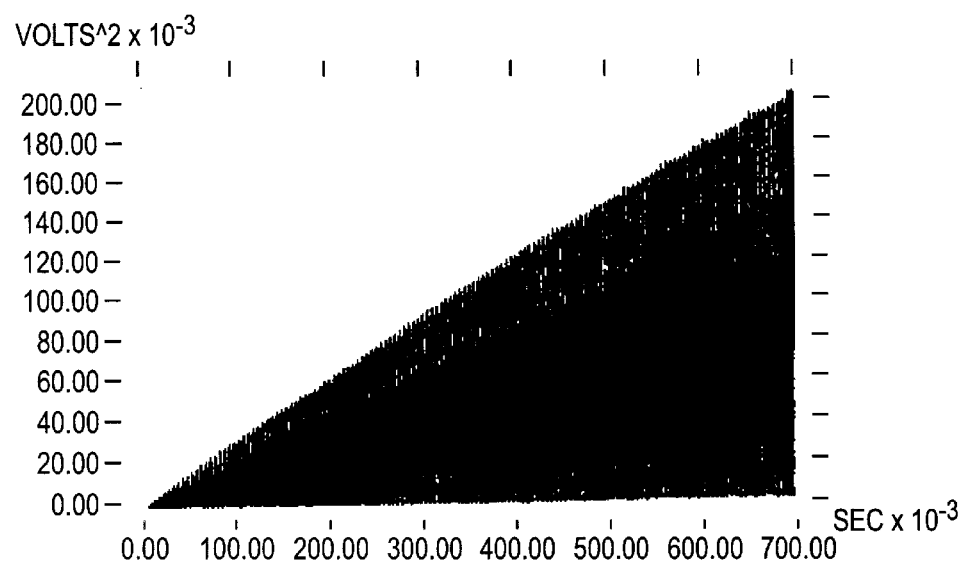

The oscillator model that was simulated has two state variables and a single stationary noise source. FIG. 7E shows a plot of the periodic nonnegative scalar $$v_1^T(t)B(x_s(t))B^T(x_s(t))v_1(t)=(v_1^T B)^2$$

where 2×1B is independent of t since the noise source is stationary. Recall from equation 18 that c is the time average of this scalar that is periodic in time.

c can also be obtained relatively accurately in this case using Monte-Carlo analysis. We simulated the circuit 600 with 10000 random excitations and averaged the results to obtain the mean-square difference between the perturbed and unperturbed systems as a function of time. FIG. 7F illustrates the result, the slope of the envelope of which determines c. The Monte-Carlo simulations required small time-steps to produce accurate results, since numerical integration methods easily lose accuracy for autonomous circuits.

The total computation time for Monte-Carlo was about 10 hours on a fast SGI workstation (R2000 CPU), whereas the present invention required about 20 seconds—a speedup of more than 3 orders of magnitude.

It is to be understood that the embodiments and variations shown and described herein are merely illustrative of the principles of this invention and that various modifications may be implemented by those skilled in the art without departing from the scope and spirit of the invention.

We claim:

1. A method of characterizing the phase noise of an oscillator due to a perturbation in said oscillator, said oscillator represented with a system of differential equations, said method comprising the steps of:

estimating said perturbation;

deriving from said representation of said oscillator a nonlinear differential equation representing said phase of said oscillator; and using said perturbation as an input to said nonlinear differential equation for said phase noise to characterize said phase noise.

2. The method according to claim 1, wherein said output of said oscillator with phase noise is represented as a phase deviation to the unperturbed oscillator response, $x_s(t+\alpha(t))$.

3. The method according to claim 2, wherein said nonlinear differential equation is given by:

$$\frac{d\alpha(t)}{dt} = v_1^T(t+\alpha(t))B(x_s(t+\alpha(t)))b(t), \quad \alpha(0)=0. \qquad \text{Eq. 6}$$

4. The method according to claim 3, where $v_1^T$ is calculated with a time domain process.

5. The method according to claim 3, where $v_1^T$ is calculated with a frequency domain process.

6. A method of stochastically characterizing the phase noise of an oscillator, said oscillator comprised of a plurality of component devices, said oscillator represented with a system of differential equations, said method comprising the steps of:

estimating the random noise generated by each of said component devices;

deriving from said representation of said oscillator a nonlinear differential equation representing said phase of said oscillator; and obtaining the stochastic characterization of said phase noise of said oscillator based on a nonlinear differential equation for said phase noise.

7. The method according to claim 6, wherein said output of said oscillator with phase noise is represented as a phase deviation to the unperturbed oscillator response, $x_s(t+\alpha(t))$.

8. The method according to claim 7, wherein said nonlinear differential equation is given by:

$$\frac{d\alpha(t)}{dt} = v_1^T(t+\alpha(t))B(x_s(t+\alpha(t)))b(t), \quad \alpha(0)=0. \qquad \text{Eq. 6}$$

9. The method according to claim 8, where $v_1^T$ is calculated with a time domain process.

10. The method according to claim 8, where $v_1^T$ is calculated with a frequency domain process.

11. A method of stochastically characterizing the phase noise of an oscillator, said oscillator comprised of a plurality of component devices, said method comprising the steps of:

estimating the white random noise generated by each of said component devices;

characterizing said phase noise of said oscillator with a single scalar constant, said scalar constant being the rate of change of the linearly increasing variance of said phase noise; and characterizing the output of said oscillator with phase noise as a stationary stochastic process using a statistical ensemble average that is not averaged over time.

12. The method according to claim 11, wherein said output of said oscillator with phase noise is represented as a phase deviation to the unperturbed oscillator response, $x_s(t+\alpha(t))$.

13. The method according to claim 12, wherein said nonlinear differential equation is given by:

$$\frac{d\alpha(t)}{dt} = v_1^T(t+\alpha(t))B(x_s(t+\alpha(t)))b(t), \quad \alpha(0) = 0 \qquad \text{Eq. 6}$$

14. The method according to claim 13, wherein $v_1^T$ is calculated with a time domain process.

15. The method according to claim 13, wherein $v_1^T$ is calculated with a frequency domain process.

16. The method according to claim 13, wherein said scalar constant, c, is given by:

$$c = \frac{1}{T}\int_0^T v_1^T(\tau)B(x_s(\tau))B^T(x_s(\tau))v_1(\tau)d\tau \qquad \text{Eq. 8}$$

17. The method according to claim 13, further comprising the step of characterizing the spectrum of said stationary process.

18. The method according to claim 17, wherein said spectrum, $S(f)$, is given by:

$$S(f) = 2\sum_{i=-\infty}^{\infty} Xi\, Xi^* \frac{f_0^2 i^2 c}{\pi^2 f_0^4 i^4 c^2 + (f+if_0)^2} \qquad \text{Eq. 10}$$

* * * * *